United States Patent [19]

Swenson

[11] Patent Number: 4,595,792
[45] Date of Patent: Jun. 17, 1986

[54] METHOD FOR DETECTING FAULTS IN A SYNTHETIC ELECTRO-MECHANICAL CABLE

[75] Inventor: Richard C. Swenson, Carriere, Miss.

[73] Assignee: The United States of America as represented by the Secretary of the Navy, Washington, D.C.

[21] Appl. No.: 481,521

[22] Filed: Apr. 1, 1983

[51] Int. Cl.$^4$ .......................... H01B 7/32; H01B 9/02
[52] U.S. Cl. ....................... 174/102 SC; 174/120 SC; 174/121 SR
[58] Field of Search ......... 174/102 R, 102 SC, 102 C, 174/120 SC, 121 R, 121 SR

[56] References Cited

U.S. PATENT DOCUMENTS

| | | | |
|---|---|---|---|
| 1,987,508 | 1/1935 | Johns et al. | 174/102 SC |
| 2,293,677 | 8/1942 | Slayter | 174/102 SC |
| 2,399,314 | 4/1946 | Barker et al. | 174/102 SC |
| 2,408,416 | 10/1946 | Edgar et al. | 174/102 R |
| 3,491,290 | 1/1970 | Peschel | 324/54 |
| 4,059,847 | 11/1977 | Phillips | 174/47 X |
| 4,151,461 | 1/1978 | Pontre | 324/54 |

Primary Examiner—A. T. Grimley
Assistant Examiner—Morris H. Nimmo
Attorney, Agent, or Firm—R. F. Beers; H. A. David

[57] ABSTRACT

A method for detecting faults in a synthetic electro-mechanical cable uses an insulated conductor dipped in a slurry of graphite prior to being overbraided with the synthetic reinforcement material. Enough graphite oozes through the braid to insure a conductive path through the multiple layers of cable on a metal take-up reel to megger the finished cable between the conductor and the metal reel.

2 Claims, 1 Drawing Figure

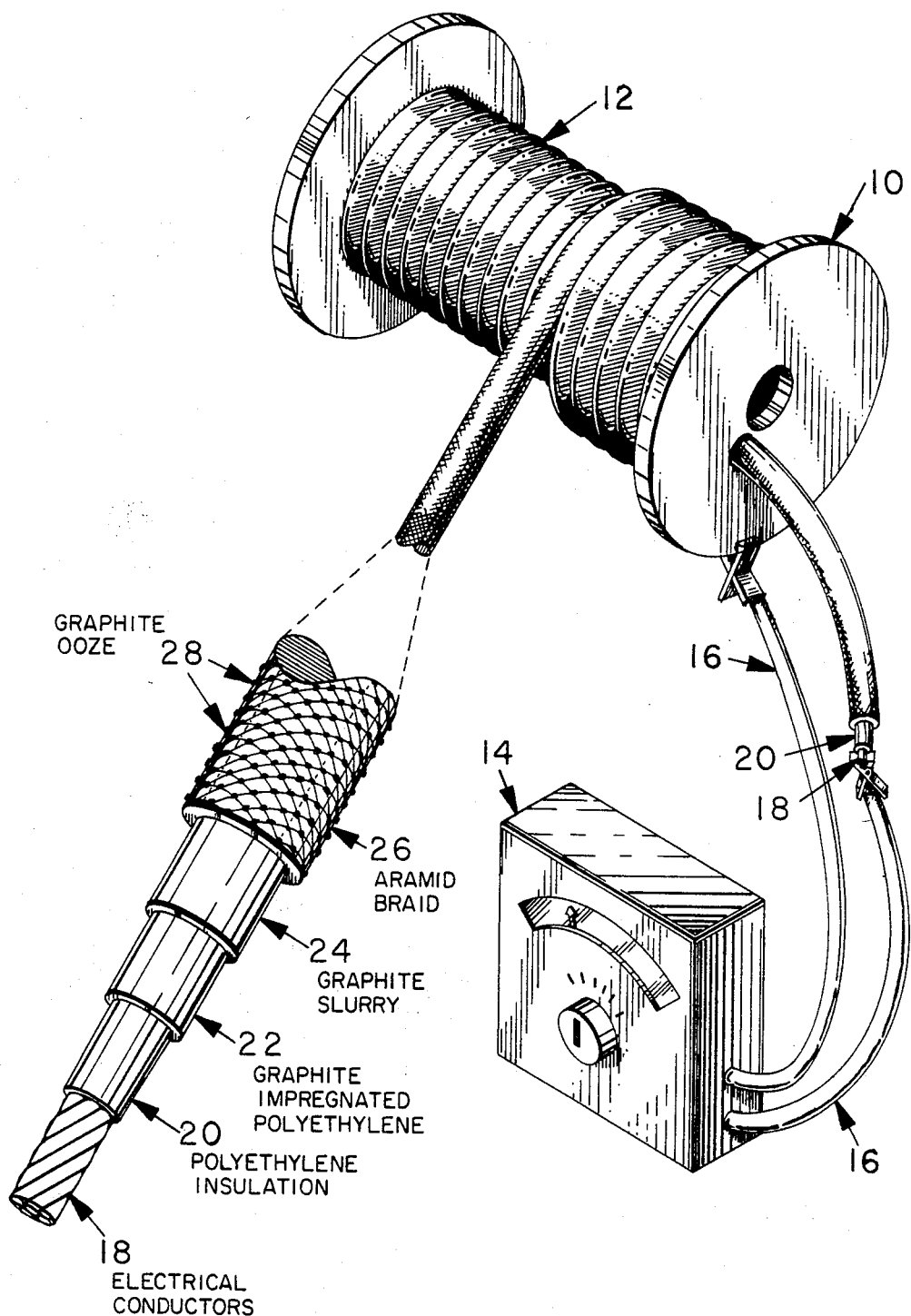

METHOD FOR DETECTING FAULTS IN A SYNTHETIC ELECTRO-MECHANICAL CABLE

BACKGROUND OF THE INVENTION

1. Field of the Invention

The present invention relates to the integrity testing of electrical conductors, and more particularly to a method for detecting faults in a synthetic electro-mechanical cable for marine use caused by damage to the conductor insulation.

2. Description of the Prior Art

Detection of an electrical short in the conductor of a synthetic electro-mechanical cable, such as would result in a wound or imperfection in the insulation, is difficult due to the fact that the synthetic reinforcement, such as Kevlar, is a non-conductor. Therefore, there is nothing against which to megger the insulation resistance of the conductor, such as is the case with steel-armored cable. This difficulty is compounded when the cable is wound on a payout bail in which all the voids are filed with a non-conductive filler such as depolymerized rubber. Thus, a short cannot be found by immersing the finished bail in water and meggering the insulation resistance of the conductor against the conductive water, i.e., no water path exists. This also may be the case of a tightly wound reel of cable where there is no assurance of good water penetration without applying pressure. The result is a difficulty in testing synthetically strengthened electro-mechanical cables, with any faults appearing only when the cable is deployed in a marine environment, an undesirable situation.

SUMMARY OF THE INVENTION

Accordingly, the present invention provides a method for detecting faults in a synthetic electro-mechanical cable. The insulated conductor is dipped in a slurry of graphite prior to being overbraided with the synthetic reinforcement material. Enough graphite oozes through the braid to insure a conductive path through the multiple layers of cable on a take up reel to megger finished cable between the conductor and the metal reel.

Thus, it is an object of the present invention to provide a method of detecting faults in a synthetic electro-mechanical cable prior to deployment of the cable.

Other objects, advantages and novel features of the present invention will be apparent from the following detailed description when read in conjunction with the appended claims and attached drawing.

BRIEF DESCRIPTION OF THE DRAWING

The FIGURE is a perspective view of a reel of synthetic electro-mechanical cable being tested for faults.

DESCRIPTION OF THE PREFERRED EMBODIMENT

Referring to the FIGURE a typical metal reel 10 has a bail of cable 12 wound upon it. A meggering instrument 14 has its leads 16 connected one to the reel 10 and one to the electrical conductor 18 of the cable 12. The cable 12 typically has one or more electrical conductors of copper or the like encased in insulation 20 such as polyethylene. A second thin layer of graphite impregnated polyethylene 22 may surround the insulation 20. Typical thicknesses are on the order of 15 mils for the insulation 20 and 1.5 mils for the outer layer 22.

The partially completed cable is then dipped into a graphite slurry, such as "Electrodag" 115 or 117, a proprietary product of Acheson Colloids Company, by any suitable means, such as dip roller, to form a slurry layer 24. Finally the synthetic reinforcement outer layer 26 of "Kevlar" or the like aramid material is braided on to complete the cable 12. The graphite slurry 28 oozes through the braid 26 to form a conductive path from the outer braid to the electrical conductor 18 if there is a break in the insulation 20.

The cable 12 is wound on the bail or reel 10 and the graphite ooze 28 provides good electrical contact with the reel and with all layers of the cable. If a wound or imperfection in the insulation 20 exists, the graphite slurry 24 wets the wound and provides the conductive path between the electrical conductor 18, via the graphite ooze 28 to the reel 10 for subsequent meggering. If a fault exists, a decrease in resistance of two orders of magnitude is observed, clearly identifying a fault.

Thus, the present invention provides a method for detecting faults in finished synthetic electro-mechanical cables, and can be used also to detect faults during the overbraiding process in cable manufacture to reduce the amount of scrap cable produced.

What is claimed is:

1. An improved synthetic electro-mechanical cable which provides means for detecting faults by subsequent meggering of the type having an electrical conductor, an insulation layer and a braided outer reinforcement layer of synthetic fiber, the improvement comprising an electrically conductive, graphite impregnated polyethylene layer disposed on and surrounding said insulation layer and a slurry layer of conductive material between said conductive graphite impregnated polyethylene layer and said reinforcement layer, said slurry layer of conductive material impregnating and oozing through said reinforcement layer so as to provide good electrical contact with a metal reel when wound thereon and thus to provide an electrical path between the surface of said reinforcement layer and said electrical conductor should there be a break in said insulation layer.

2. The improved cable of claim 1 wherein said layer of conductive material comprises a graphite slurry.

* * * * *